(12) United States Patent
Satoh

(10) Patent No.: US 10,931,289 B2
(45) Date of Patent: Feb. 23, 2021

(54) DLL CIRCUIT HAVING VARIABLE CLOCK DIVIDER

(71) Applicant: MICRON TECHNOLOGY, INC., Boise, ID (US)

(72) Inventor: Yasuo Satoh, Tsukuba (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/536,079

(22) Filed: Aug. 8, 2019

(65) Prior Publication Data

US 2019/0363724 A1 Nov. 28, 2019

Related U.S. Application Data

(63) Continuation of application No. 16/136,046, filed on Sep. 19, 2018, now Pat. No. 10,461,759, which is a continuation of application No. 15/786,362, filed on Oct. 17, 2017, now Pat. No. 10,110,240.

(51) Int. Cl.
| | | |
|---|---|---|
| *H03L 7/183* | (2006.01) | |
| *H03L 7/193* | (2006.01) | |
| *H03K 5/13* | (2014.01) | |
| *H03L 7/08* | (2006.01) | |
| *H03K 21/10* | (2006.01) | |
| *H03L 7/099* | (2006.01) | |

(52) U.S. Cl.
CPC ............. *H03L 7/193* (2013.01); *H03K 5/13* (2013.01); *H03K 21/10* (2013.01); *H03L 7/0805* (2013.01); *H03L 7/0997* (2013.01)

(58) Field of Classification Search
USPC .................................. 327/147–149, 156–158
See application file for complete search history.

(56) References Cited

U.S. PATENT DOCUMENTS

| | | | | |
|---|---|---|---|---|
| 6,181,174 B1* | 1/2001 | Fujieda | ..................... | G06F 1/08 327/158 |
| 8,085,101 B2* | 12/2011 | Yamamoto | ........... | H03B 5/1228 331/78 |
| 8,154,782 B1* | 4/2012 | Brown | ............... | G02B 26/0833 359/199.1 |
| 9,614,534 B1* | 4/2017 | Shi | ........................ | H03L 7/0816 |
| 10,110,240 B1* | 10/2018 | Satoh | .................... | H03L 7/0805 |
| 2004/0008063 A1* | 1/2004 | Kim | ........................ | H03L 7/16 327/158 |
| 2004/0012423 A1* | 1/2004 | Maeda | ...................... | H03L 7/23 327/156 |
| 2004/0151271 A1* | 8/2004 | Krueger | .................. | H03L 7/104 375/376 |
| 2004/0222831 A1* | 11/2004 | Mitsumoto | ............. | H03L 7/191 327/157 |
| 2005/0077935 A1* | 4/2005 | Giuroiu | ................. | H03L 7/1976 327/156 |

(Continued)

*Primary Examiner* — Adam D Houston
(74) *Attorney, Agent, or Firm* — Dorsey & Whitney LLP

(57) ABSTRACT

Disclosed herein is an apparatus that includes a variable clock divider configured to divide a first clock signal to generate a second clock signal, a delay circuit configured to delay the second clock signal to generate a third clock signal, and a phase detector configured to compare phases of the second and third clock signals. The variable clock divider has a division ratio that is variable based, at least in part, on a delay amount of the delay circuit.

20 Claims, 12 Drawing Sheets

(56) References Cited

U.S. PATENT DOCUMENTS

| | | | | | |
|---|---|---|---|---|---|
| 2006/0132202 A1* | 6/2006 | Meltzer | H03L 7/23 327/156 |
| 2007/0146025 A1* | 6/2007 | Huang | H03K 5/1565 327/156 |
| 2007/0152723 A1* | 7/2007 | Ahn | H03L 7/0814 327/158 |
| 2008/0001640 A1* | 1/2008 | Choi | H03L 7/0812 327/158 |
| 2008/0136479 A1* | 6/2008 | You | H03L 7/0812 327/161 |
| 2009/0273378 A1* | 11/2009 | Mangnall | G06F 9/4401 327/156 |
| 2010/0123491 A1* | 5/2010 | Palmer | H03L 7/07 327/156 |
| 2010/0165721 A1* | 7/2010 | Shin | G11C 5/145 365/163 |
| 2010/0264962 A1* | 10/2010 | Kitayama | H03L 1/026 327/156 |
| 2010/0321074 A1* | 12/2010 | Song | H03L 7/1072 327/157 |
| 2011/0009083 A1* | 1/2011 | Namba | H03L 7/1976 455/318 |
| 2011/0032013 A1* | 2/2011 | Nelson | H03L 7/23 327/156 |
| 2011/0122973 A1* | 5/2011 | Tsukio | H03L 7/197 375/316 |
| 2011/0227618 A1* | 9/2011 | Miyano | G06F 1/04 327/158 |
| 2011/0234272 A1* | 9/2011 | Yu | H03L 7/089 327/157 |
| 2011/0248752 A1* | 10/2011 | Willey | H03L 7/0816 327/117 |
| 2012/0163519 A1* | 6/2012 | Choudhury | H04L 7/033 375/354 |
| 2013/0147529 A1* | 6/2013 | Ganesan | H03L 7/1803 327/156 |
| 2013/0249719 A1* | 9/2013 | Ryan | H03M 1/06 341/118 |
| 2014/0266351 A1* | 9/2014 | Na | H03L 7/0812 327/158 |
| 2015/0162917 A1* | 6/2015 | Tsukuda | H03L 7/197 327/115 |
| 2015/0222469 A1* | 8/2015 | Onishi | H04L 7/0331 375/376 |
| 2015/0372683 A1* | 12/2015 | Takahashi | H03L 7/0814 365/233.1 |
| 2016/0079988 A1* | 3/2016 | Shiozaki | H03L 7/087 327/156 |
| 2016/0099719 A1* | 4/2016 | Iwasaki | H03L 7/0805 327/131 |
| 2016/0142060 A1* | 5/2016 | Im | H03L 7/08 327/158 |
| 2016/0156342 A1* | 6/2016 | Yun | H03K 7/08 327/158 |
| 2016/0173109 A1* | 6/2016 | Montoriol | H03L 7/1976 327/156 |
| 2016/0173111 A1* | 6/2016 | Cali | H03L 7/1976 327/156 |
| 2016/0380752 A1* | 12/2016 | Ahmad | H03L 7/085 327/158 |
| 2017/0250694 A1* | 8/2017 | Im | H03L 7/18 |
| 2019/0115928 A1 | 4/2019 | Satoh | |

\* cited by examiner

| N | ODD | SEL23 | SEL45 | SEL67 | SEL89 |
|---|---|---|---|---|---|
| 2 | L | H | L | L | L |
| 3 | H | H | L | L | L |
| 4 | L | L | H | L | L |
| 5 | H | L | H | L | L |
| 6 | L | L | L | H | L |
| 7 | H | L | L | H | L |
| 8 | L | L | L | L | H |
| 9 | H | L | L | L | H |

FIG. 2

DLL CIRCUIT HAVING VARIABLE CLOCK DIVIDER

CROSS-REFERENCE TO RELATED APPLICATION

This application is a continuation of U.S. patent application Ser. No. 16/136,046, filed Sep. 19, 2018 and issued as U.S. Pat. No. 10,461,759 on Oct. 29, 2019, which is a continuation of U.S. patent application Ser. No. 15/786,362, filed Oct. 17, 2017 and issued as U.S. Pat. No. 10,110,240 on Oct. 23, 2018, These applications and patents are incorporated by reference herein in their entirety and for all purposes.

BACKGROUND

In a synchronous memory device represented by a synchronous DRAM, a DLL circuit is used to correctly synchronize an output timing of a read data with an external clock signal. An output clock signal generated by the DLL circuit is supplied to an output buffer via a clock tree. When an internal clock signal with a high frequency propagates to the clock tree, current consumption increases. Accordingly, in a period in which no read data is output, the DLL circuit is stopped or the frequency of the internal clock signal is lowered to reduce the current consumption.

In a method of stopping the DLL circuit during a period in which no read data is output, the DLL circuit is periodically activated to correct misalignment of the output clock signal caused by PVT fluctuations. In a method of lowering the frequency of the internal clock signal during a period in which no read data is output, the internal clock signal is divided by a clock divider.

The DLL circuit includes a phase detector to determine the phases of the external clock signal and the internal clock signal. When the phase detector is placed at a subsequent stage of the clock divider, the phase detector cannot determine the phases in some relations between a division ratio of the clock divider and a DLL forward path delay.

BRIEF DESCRIPTION OF THE DRAWINGS

FIG. 2 is a truth table for explaining an operation of a decoder shown in FIG. 1.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
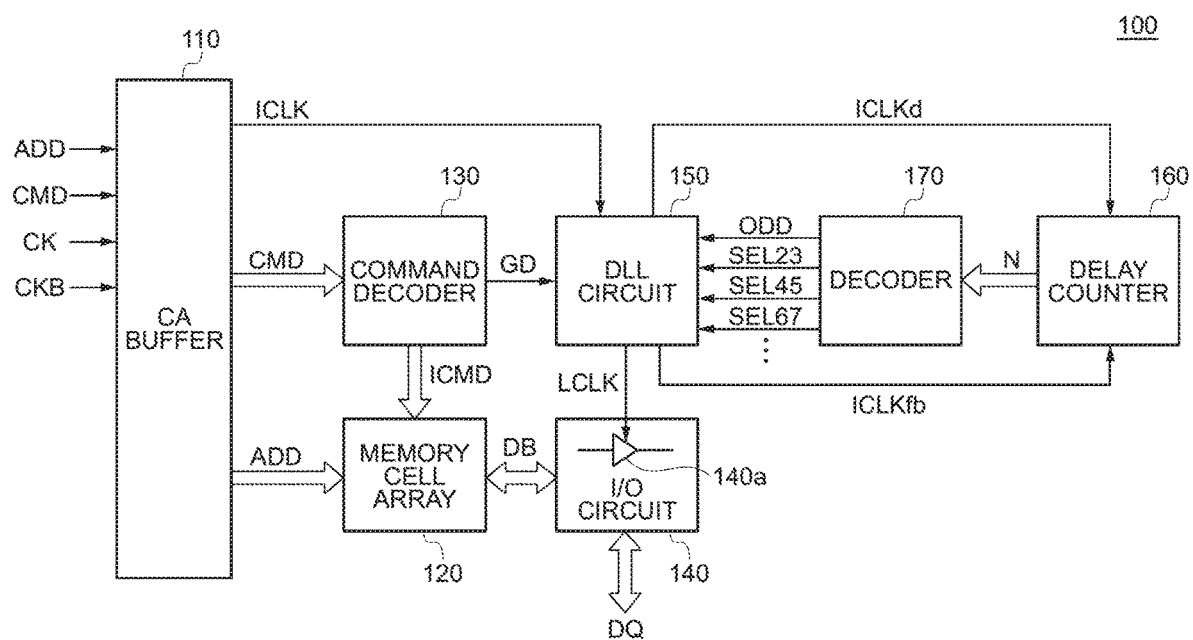
FIG. 1 is a block diagram showing a configuration of a semiconductor device.

A semiconductor device 100 shown in FIG. 1 is a synchronous DRAM. An address signal ADD, a command signal CMD, and external clock signals CK and CKB are supplied to the semiconductor device 100 via a command address (CA) buffer 110. The CA buffer 110 supplies the address signal ADD to a memory cell array 120 and supplies the command signal CMD to a command decoder 130. The command decoder 130 decodes the command signal CMD to generate an internal command signal ICMD. The memory cell array 120 performs a read operation or a write operation based on the address signal ADD and the internal command signal ICMD. When the internal command signal ICMD indicates a read operation, a data is read from a memory cell designated by the address signal ADD and is supplied to an I/O circuit 140 via a data bus DB. The I/O circuit 140 includes an output buffer 140a. The output buffer 140a outputs a read data DQ to outside the semiconductor device 100 synchronously with an output clock signal LCLK.

The output clock signal LCLK is generated by a DLL circuit 150. The DLL circuit 150 delays an internal clock signal ICLK to generate the output clock signal LCLK. The internal clock signal ICLK is generated based on the external clock signals CK and CKB which are complementary with each other, and has a frequency equal to that of the external clock signals CK and CKB. A delay counter 160 may start measuring the time using a rising edge of an internal clock signal ICLKd at a time immediately after the DLL circuit 150 is reset as a trigger and may end the measurement using a rising edge of an internal clock signal ICLKfb output first after the DLL circuit 150 is reset as a trigger, thereby measuring the delay amount of the entire clock tree. The time measured by the delay counter 160 indicates the total delay amount of the CA buffer 110, the DLL circuit 150, and the I/O circuit 140 and this value is defined by N times of a clock cycle of the internal clock signal ICLK. The value of N is decoded by a decoder 170 and an odd signal ODD, a selection signal SEL23, a selection signal SEL45, a selection signal SEL67, etc. are generated. These signals are input to the DLL circuit 150. As shown in FIG. 2, the odd signal ODD takes a high level when the value of N is odd. The selection signal SEL23 takes a high level when the value of N is 2 or 3. The selection signal SEL45 takes a high level when the value of N is 4 or 5. The selection signal SEL67 takes a high level when the value of N is 6 or 7. It is sufficient that the number of selection signals is determined responsive to values that can be taken by N. The measurement of the delay amount by the delay counter 160 may be performed once each time the DLL circuit 150 is reset whether the DLL circuit 150 operates in a dividing mode or in a non-dividing mode. A reset operation of the DLL circuit 150 may be achieved by an initial sequence after power activation or an issuance of a DLL Reset command. The delay amount of the DLL circuit 150 is irrelevant to the operation mode. The value of N is stored in the delay counter 160 and is held until the DLL circuit 150 is reset. When the DLL circuit 150 is reset, the measurement of the delay amount by the delay counter 160 may be performed again and the value of N may be updated.

Figure 3A:
FIG. 3A and FIG. 3B are timing charts for explaining a relation between a command signal CMD and a gear down signal.
Figure 3B:
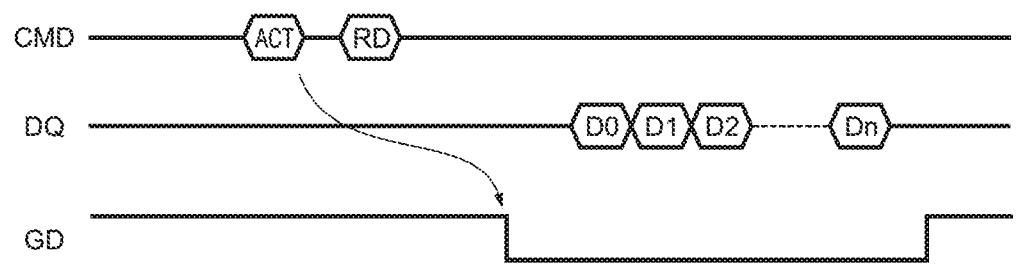

A gear down signal GD is also supplied to the DLL circuit 150 from the command decoder 130. When the gear down signal GD is activated, the DLL circuit 150 is brought into the dividing mode and the frequency of the output signal LCLK becomes lower than that of the internal clock signal ICLK. This reduces the current consumption. When the gear down signal GD is deactivated, the DLL circuit 150 is brought into the non-dividing mode and the frequency of the output clock signal LCLK becomes equal to the frequency of the internal clock signal ICLK. The gear down signal GD changes according to the command signal CMD. For example, as shown in FIG. 3A, the gear down signal GD may be deactivated responsive to a power down exit command (PDEX) and may be activated responsive to a power down entry command (PDEN). Accordingly, in a period in which the semiconductor device 100 operates in a power down mode, the DLL circuit 150 is brought into the dividing mode and thus the current consumption is reduced. Both in the non-dividing mode and the dividing mode, adjustment of the delay amount is performed by a delay adjustment circuit 240 (with reference to FIG. 4) in response to a result of a phase detector 220. However, because the value of N is determined at the time of reset and is held as described above, the same value is held until the next reset even when the delay adjustment circuit 240 adjusts the delay amount. Alternatively, the gear down signal GD may be deactivated for a certain period when the command signal CMD indicates a read operation as shown in FIG. 3B. In this case, when the read operation ends, the gear down signal GD may be activated automatically.

Figure 4:
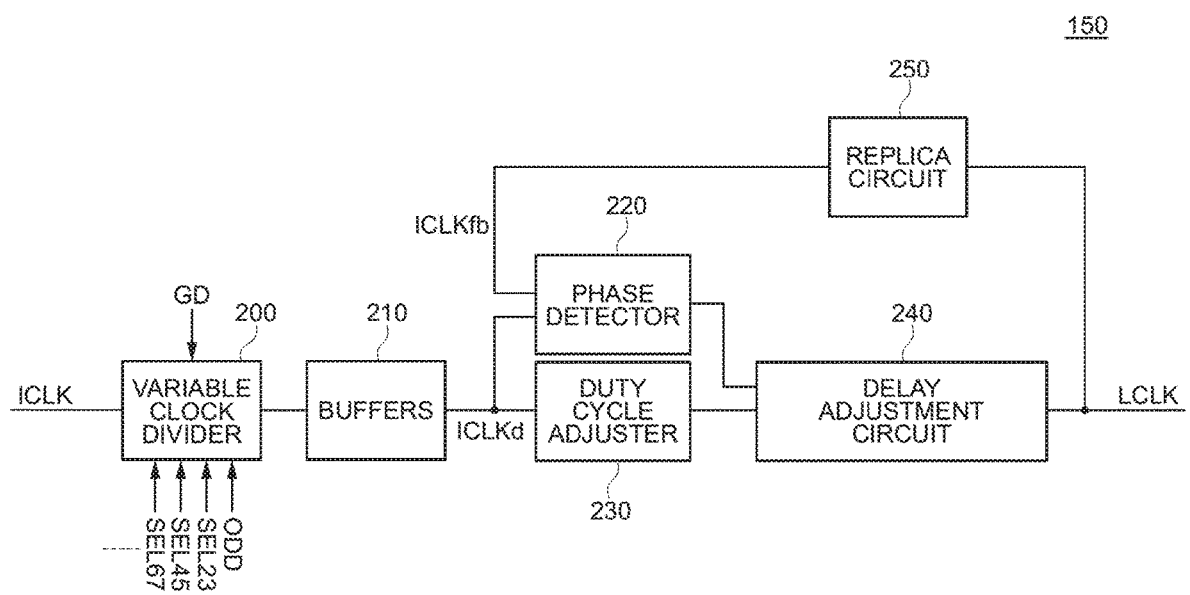
FIG. 4 is a block diagram showing a configuration of a DLL circuit shown in FIG. 1.

As shown in FIG. 4, the DLL circuit 150 includes a variable clock divider 200 that divides the internal clock signal ICLK. The variable clock divider 200 divides the internal clock signal ICLK when the gear down signal GD is activated, and does not divide the internal clock signal ICLK to be output as it is when the gear down signal GD is deactivated. The division ratio of the variable clock divider 200 can be varied by the odd signal ODD, the selection signal SEL23, the selection signal SEL45, the selection signal SEL67, etc.

The internal clock signal ICLKd output from the variable clock divider 200 is supplied to the phase detector 220 and a duty cycle adjuster 230 via buffers 210. The duty cycle adjuster 230 adjusts the duty cycle of the internal clock signal ICLKd to 50%. The internal clock signal ICLKd having the duty cycle adjusted to 50% is input to the delay adjustment circuit 240. The delay adjustment circuit 240 delays the internal clock signal ICLKd to generate the output clock signal LCLK. The output clock signal LCLK is supplied to the output buffer 140a shown in FIG. 1.

The output clock signal LCLK is fed back to the phase detector 220 via a replica circuit 250. The replica circuit 250 has the same delay amount as the total delay amount of the output buffer 140a, the CA buffer 110, the variable clock divider 200, and the buffers 210. Accordingly, the internal clock signal ICLKfb output from the replica circuit 250 correctly matches the output timing of the read data DQ output from the output buffer 140a. The phase detector 220 determines the phases of the internal clock signal ICLKd and the internal clock signal ICLKfb to control the delay amount of the delay adjustment circuit 240 based on the determined phases.

Figure 5:
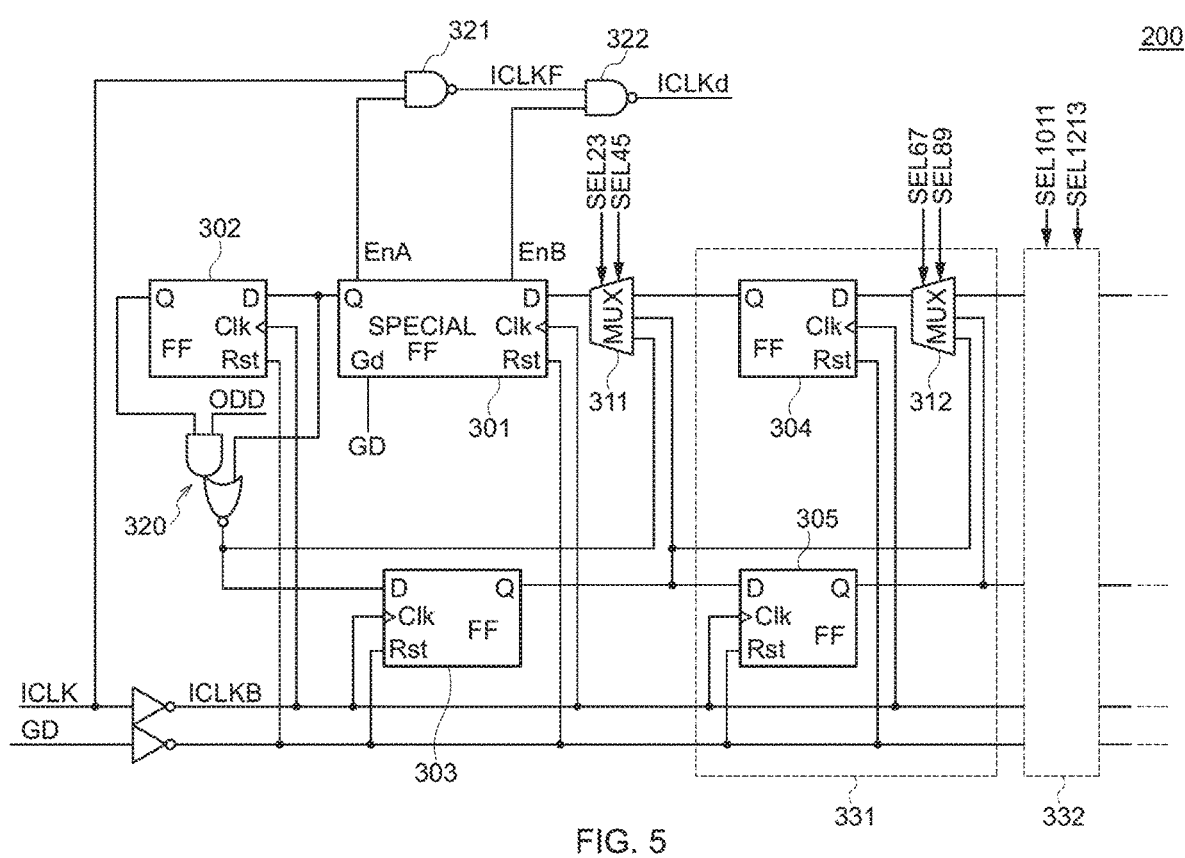
FIG. 5 is a block diagram showing a configuration of a variable clock divider shown in FIG. 1.

As shown in FIG. 5, the variable clock divider 200 includes a plurality of flip-flop circuits 301, 302, 303, 304, 305, etc. The flip-flop circuits 301, 302, 303, 304, 305, etc. latch a data input to corresponding data input nodes D synchronously with the internal clock signal ICLKB and output the latched data from corresponding data output nodes Q, respectively. Because an inversion signal ICLKB of the internal clock signal ICLK is input to clock input nodes Clk of the flip-flop circuits 301, 302, 303, 304, 305, etc., the flip-flop circuits 301, 302, 303, 304, 305, etc. output a data synchronously with a rising edge of the internal clock signal ICLK, respectively. The flip-flop circuits 301, 302, 303, 304, 305, etc. are reset when the gear down signal GD is deactivated to a low level. While the flip-flop circuits 302, 303, 304, 305, etc. have the same circuit configuration as that of a general flip-flop circuit, the flip-flop circuit 301 is a special flip-flop circuit having a logic gate circuit for generating enable signals EnA and EnB added thereto.

The flip-flop circuit 301 has a gear-down selection node Gd. The gear down signal GD is supplied to the gear-down selection node Gd. The flip-flop circuit 301 performs clocking of the enable signals EnA and EnB when the gear down signal GD is activated to a high level, and fixes the enable signals EnA and EnB to a high level when the gear down signal GD is deactivated to a low level.

An output signal of a multiplexer 311 is supplied to the data input node D of the flip-flop circuit 301. The multiplexer 311 receives an output data of a logic gate circuit 320, an output data of the flip-flop circuit 303, and an output data of the flip-flop circuit 304 and outputs any of the data based on the selection signals SEL23 and SEL45. The logic gate circuit 320 is placed at a subsequent stage of the flip-flop circuit 302 and a path passing through the flip-flop circuit 302 is enabled when the odd signal ODD is activated to a high level. When the odd signal ODD is at a low level, the flip-flop circuit 302 is bypassed.

The multiplexer 311 selects the output data of the logic gate circuit 320 when the selection signal SEL23 is activated, selects the output data of the flip-flop circuit 303 when the selection signal SEL45 is activated, and selects the output data of the flip-flop circuit 304 when the selection signals SEL23 and SEL45 are both deactivated. Accordingly, when the selection signal SEL23 is activated and the odd signal ODD is deactivated (N=2), the data output node Q and the data input node D of the flip-flop circuit 301 are circularly connected. When the selection signal SEL23 is activated and the odd signal ODD is activated (N=3), the flip-flop circuits 301 and 302 are circularly connected. When the selection signal SEL45 is activated and the odd signal ODD is deactivated (N=4), the flip-flop circuits 301 and 303 are circularly connected. When the selection signal SEL45 is activated and the odd signal ODD is activated (N=5), the flip-flop circuits 301 to 303 are circularly connected. When the selection signals SEL23 and SEL45 are both deactivated and the odd signal ODD is deactivated (N=6, 8, 10, etc.), at least the flip-flop circuits 301, 303, and 304 are circularly connected. When the selection signals SEL23 and SEL45 are both deactivated and the odd signal ODD is activated (N=7, 9, 11, etc.), at least the flip-flop circuits 301 to 303 and 304 are circularly connected.

As shown in FIG. 5, the output data of the flip-flop circuit 303 is supplied to the data input node D of the flip-flop circuit 305 and a multiplexer 312. The multiplexer 312 receives the output data of the flip-flop circuit 303, an output data of the flip-flop circuit 305, and an output data of a circuit block 332 at the subsequent stage and outputs any of the data based on the selection signals SEL67 and SEL89. The multiplexer 312 selects the output data of the flip-flop circuit 303 when the selection signal SEL67 is activated, selects the output data of the flip-flop circuit 305 when the selection signal SEL89 is activated, and selects the output data of the circuit block 332 when the selection signals SEL67 and SEL89 are both deactivated.

Accordingly, when the selection signal SEL67 is activated and the odd signal ODD is deactivated (N=6), the flip-flop circuits 301, 303, and 304 are circularly connected. When the selection signal SEL67 is activated and the odd signal ODD is activated (N=7), the flip-flop circuits 301 to 304 are circularly connected. When the selection signal SEL89 is activated and the odd signal ODD is deactivated (N=8), the flip-flop circuits 301, 303, 305, and 304 are circularly connected. When the selection signal SEL89 is activated and the odd signal ODD is activated (N=9), the flip-flop circuits 301 to 303, 305, and 304 are circularly connected.

The circuit block 332 has the same circuit configuration as that of a circuit block 331. Selection signals SEL1011 and SEL1213 are input to the circuit block 332 and the circuit block 332 performs an identical operation to that of the circuit block 331 as described above according to logic levels of the selection signals SEL1011 and SEL1213. While FIG. 5 shows the two circuit blocks 331 and 332, more circuit blocks may be connected.

Figure 6:
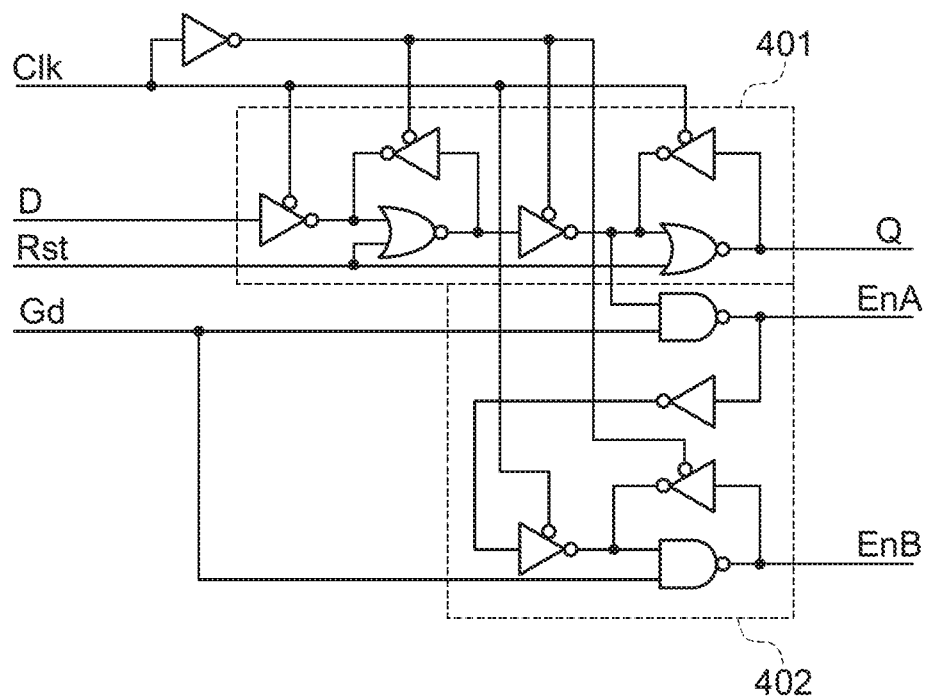
FIG. 6 is a block diagram showing a configuration of a special flip-flop circuit shown in FIG. 5.

As shown in FIG. 6, the special flip-flop circuit 301 includes a circuit 401 having the same circuit configuration as that of a general flip-flop circuit, and a circuit 402 that generates the enable signals EnA and EnB. The circuit 401 functions to latch a data supplied to the data input node D synchronously with the clock signal ICLKB and output the data from the data output node Q. The circuit 402 generates the enable signal EnA having the same logic level as that of the data output from the data output node Q on condition that the gear down signal GD is at a high level. The enable signal EnB is an inversion signal of a signal obtained by delaying the enable signal EnA by a ½ clock cycle. When the gear down signal GD is at a low level, the enable signals EnA and EnB are both fixed to a high level.

Referring back to FIG. 5, the internal clock signal ICLK and the enable signal EnA are input to a NAND gate circuit 321. An internal clock signal ICLKF output from the NAND gate circuit 321 and the enable signal EnB are input to a NAND gate circuit 322. Because the enable signals EnA and EnB are both fixed to a high level when the gear down signal GD is at a low level, the internal clock signal ICLK is not divided and is output as it is as the internal clock signal ICLKd through the NAND gate circuits 321 and 322 at two stages. Therefore, the rising edge of the internal clock signal ICLKd is substantially aligned with the rising edge of the internal clock signal ICLK. On the other hand, when the gear down signal GD is at a high level, the clock signal ICLK can pass through the NAND gate circuits 321 and 322 only in a period in which both the enable signals EnA and EnB are at a high level. The waveform of the enable signals EnA and EnB is different depending on the value of N output from the delay counter 160.

Figure 7:
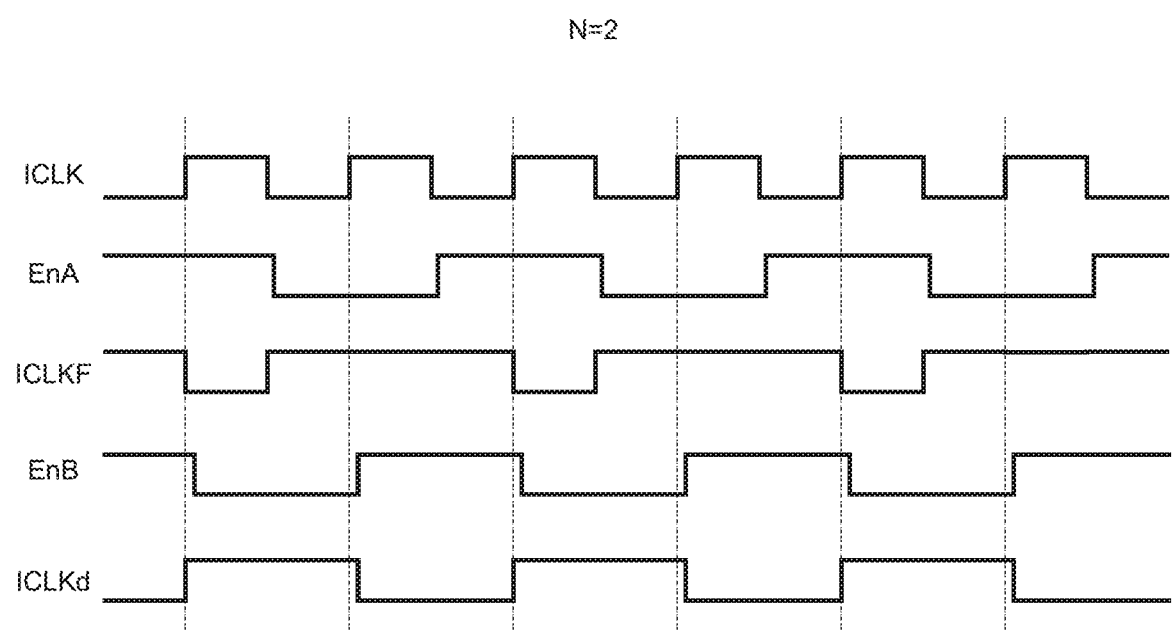
FIG. 7 is a waveform chart for explaining an operation of the DLL circuit when N is 2.

When the value of N is 2, the selection signal SEL23 is activated and the odd signal ODD is deactivated. Therefore, the data output node Q and the data input node D of the flip-flop circuit 301 are circularly connected and thus the enable signal EnA has a waveform obtained by dividing the internal clock signal ICLK by two as shown in FIG. 7. Accordingly, the internal clock signal ICLKF has a waveform in which a low-level period appears every two clock cycles. Because the enable signal EnB is an inversion signal of a signal obtained by delaying the enable signal EnA by a ½ clock cycle, the internal clock signal ICLKd output from the NAND gate circuit 322 has a waveform obtained by dividing the internal clock signal ICLK by two. Because the internal clock signal ICLKd is generated based on the internal clock signal ICLK passing through the NAND gate circuits 321 and 322 at two stages, the rising edge of the internal clock signal ICLKd is substantially aligned with the rising edge of the internal clock signal ICLK.

Figure 8:
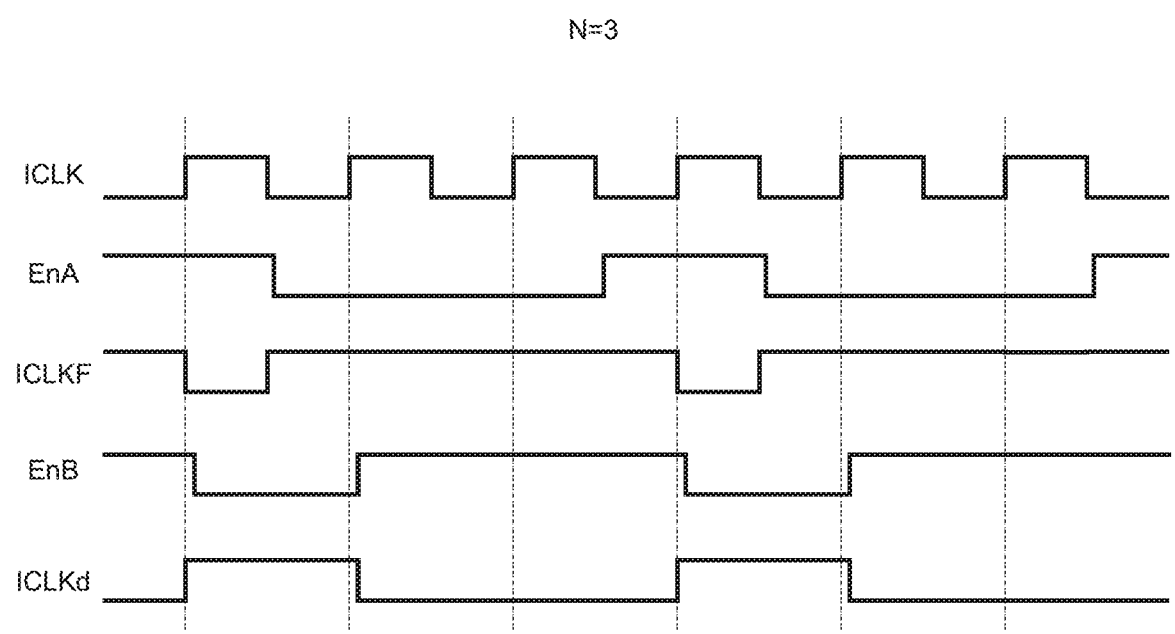
FIG. 8 is a waveform chart for explaining an operation of the DLL circuit when N is 3.

When the value of N is 3, the selection signal SEL23 is activated and the odd signal ODD is activated. Accordingly, the flip-flop circuits 301 and 302 are circularly connected and the enable signal EnA has a waveform obtained by dividing the internal clock signal ICLK by three as shown in FIG. 8. The internal clock signal ICLKd has a waveform obtained by dividing the internal clock signal ICLK by three and the rising edge thereof is substantially aligned with the rising edge of the internal clock signal ICLK.

Figure 9:
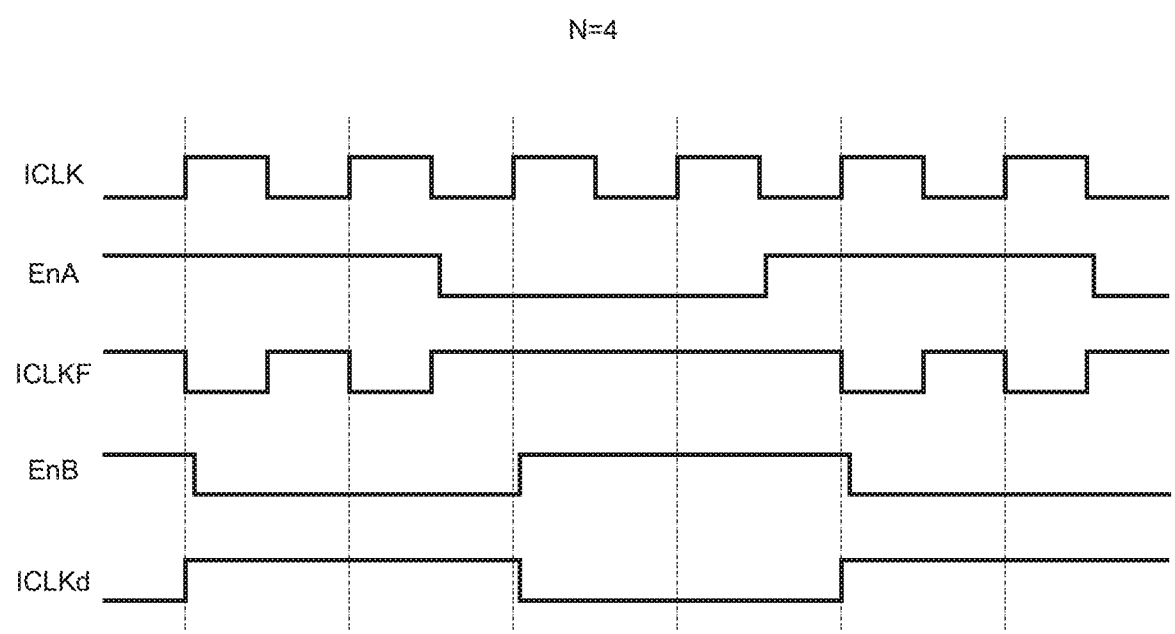
FIG. 9 is a waveform chart for explaining an operation of the DLL circuit when N is 4.

When the value of N is 4, the selection signal SEL45 is activated and the odd signal ODD is deactivated. Accordingly, the flip-flop circuits 301 and 303 are circularly connected and thus the enable signal EnA has a waveform obtained by dividing the internal clock signal ICLK by four as shown in FIG. 9. The internal clock signal ICLKd has a waveform obtained by dividing the internal clock signal ICLK by four and the rising edge thereof is substantially aligned with the rising edge of the internal clock signal ICLK.

Figure 10:
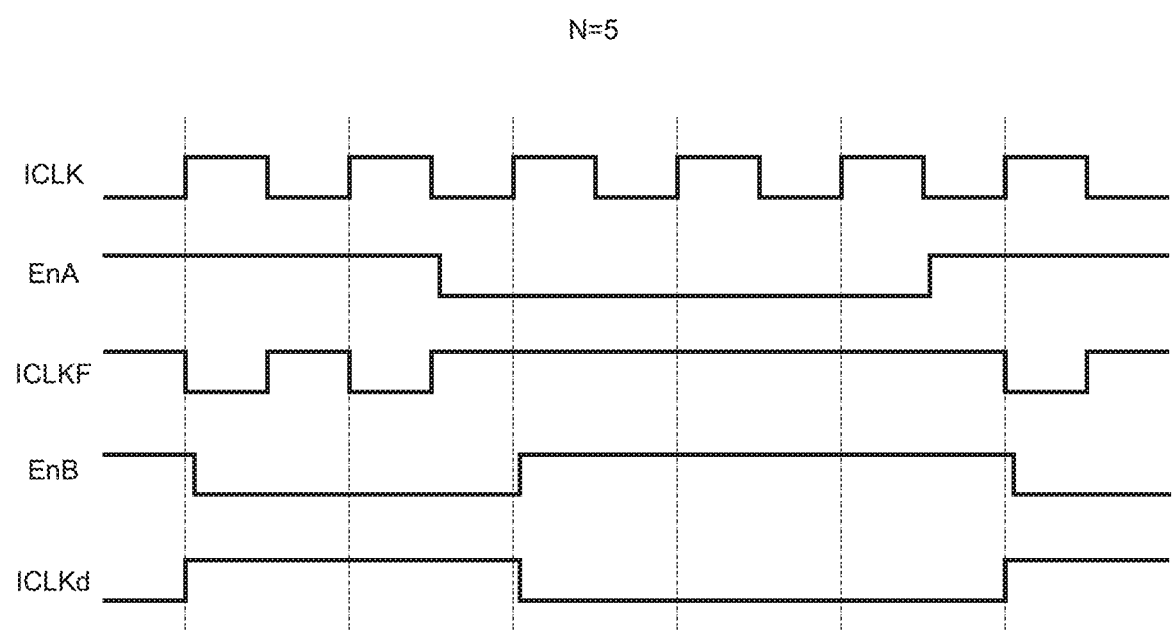
FIG. 10 is a waveform chart for explaining an operation of the DLL circuit when N is 5.

When the value of N is 5, the selection signal SEL45 is activated and the odd signal ODD is activated. Accordingly, the flip-flop circuits 301 to 303 are circularly connected and thus the enable signal EnA has a waveform obtained by dividing the internal clock signal ICLK by five as shown in FIG. 10. The internal clock signal ICLKd has a waveform obtained by dividing the internal clock signal ICLK by five and the rising edge thereof is substantially aligned with the rising edge of the internal clock signal ICLK.

Figure 11A:
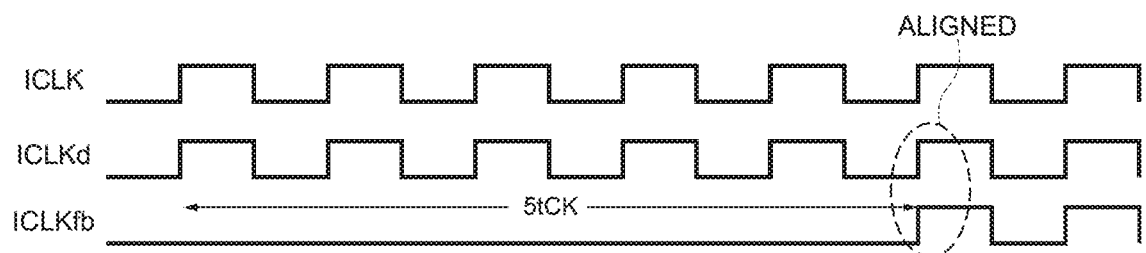
FIG. 11A to FIG. 11C are waveform charts for explaining a relation between a value of N and a division ratio.
Figure 11B:
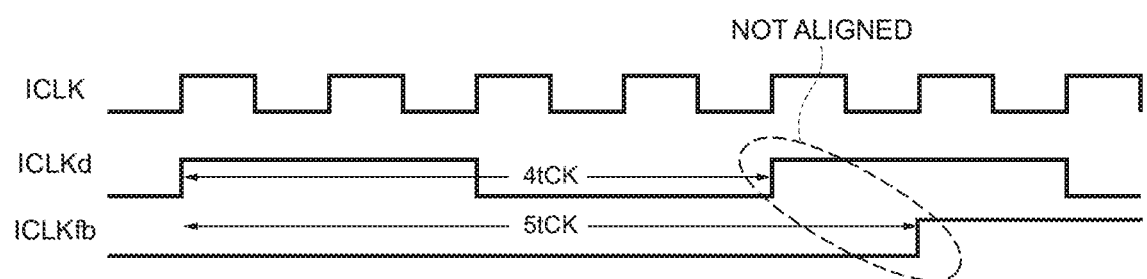
Figure 11C:
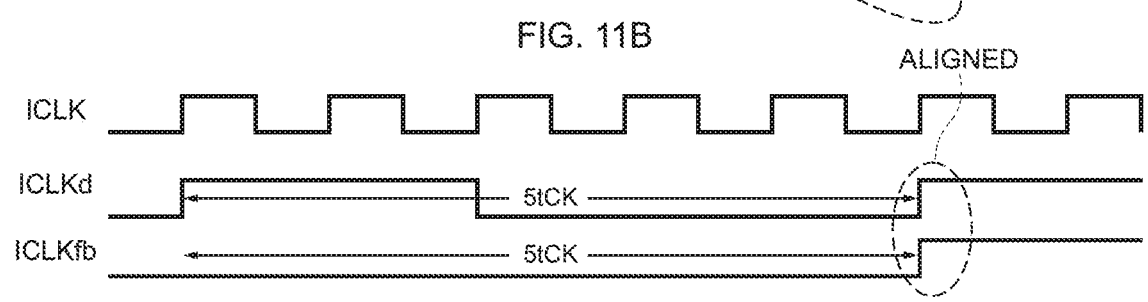

When the value of N is 5, there is a delay of 5 clock cycles (=5 tCK) between the internal clock signal ICLKd and the internal clock signal ICLKfb. Also in this case, when the DLL circuit 150 operates in the non-dividing mode, the rising edge of the internal clock signal ICLKd is aligned with the rising edge of the internal clock signal ICLKfb as shown in FIG. 11A. This is because the delay amount of the entire clock tree including the DLL circuit 150 is defined by N times of the clock cycle of the internal clock signal ICLK. Meanwhile, when the DLL circuit 150 operates in the dividing mode, the rising edge of the internal clock signal ICLKd is not aligned with the rising edge of the internal clock signal ICLKfb in some division ratios. For example, as shown in FIG. 11B, when the division ratio is set to 4 when the value of N is 5, the rising edge of the internal clock signal ICLKd and the rising edge of the internal clock signal ICLKfb are not aligned and there is a difference of one clock cycle therebetween. However, in the DLL circuit 150 according to the present embodiment, an appropriate division ratio is automatically selected responsive to the value of N and thus misalignment between the rising edge of the internal clock signal ICLKd and the rising edge of the internal clock signal ICLKfb does not occur. For example, as shown in FIG. 11C, when the value of N is 5, the division ratio is set to 5 and accordingly the rising edge of the internal clock signal ICLKd and the rising edge of the internal clock signal ICLKfb are completely aligned. Besides, because the rising edge of the internal clock signal ICLKd is substantially aligned with the rising edge of the internal clock signal ICLK regardless of the division ratio, misalignment in the timing does not occur even when the division ratio is large.

In this way, when the DLL circuit 150 according to the present embodiment is used, the rising edge of the internal clock signal ICLKd and the rising edge of the internal clock signal ICLKfb can be aligned regardless of the value of N. Accordingly, the variable clock divider 200 can be placed at an arbitrary position. Furthermore, because the DLL circuit 150 is promptly changed from the dividing mode to the non-dividing mode when the gear down signal GD changes from a high level to a low level, the set-up time can be minimized.

Figure 12A:
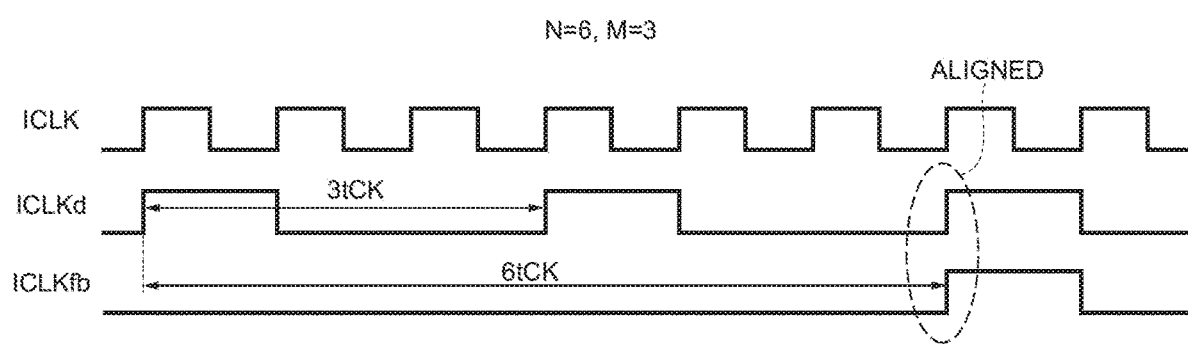
FIG. 12A and FIG. 12B are waveform charts for explaining an operation of a DLL circuit according to a modification.
Figure 12B:
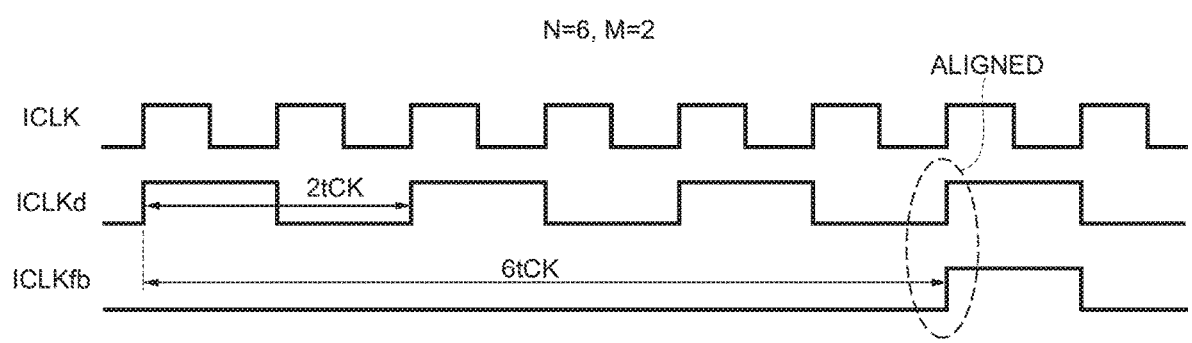

In the present invention, it is not essential that the value of N is equal to the division ratio and the division ratio M can be set to a divisor of N. For example, when the value of N is 6, the division ratio M can be set to 3 as shown in FIG. 12A or the division ratio M can be set to 2 as shown in FIG. 12B. This can reduce the division ratio M even when the value of N is large and thus enables the determination operation of the phase detector 220 to be performed more frequently.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus, comprising:
a variable clock divider configured to generate a divided clock signal based on feedback of a delay measured as a number of clock cycles of the divided clock signal; and
a delay circuit configured to receive the divided clock signal, configured to delay the divided clock signal based on the delay and provide the divided clock signal, and further configured to provide the feedback of the delay to the variable clock divider.

2. The apparatus of claim 1, further comprising:
a clock path including the delay circuit, the clock path configured to receive an internal clock signal,
wherein the variable clock divider is further configured to receive the internal clock signal and to divide the internal clock signal to generate the divided clock signal.

3. The apparatus of claim 2, wherein the variable clock divider has a division ratio responsive to the number of clock cycles of the internal clock signal exhibited during the delay to the internal clock signal by the clock path.

4. The apparatus of claim 2, wherein the variable clock divider is configured to divide the internal clock signal responsive to a first command and further configured to stop dividing the internal clock signal responsive to a second command.

5. The apparatus of claim 1, further comprising:
an output buffer; and
a replica circuit configured to receive the delayed divided clock signal and further configured to provide output clock signal feedback,
wherein the output clock signal feedback is the delayed divided clock signal having an output timing matched with an output timing of read data output from the output buffer.

6. The apparatus of claim 5, wherein the replica circuit has substantially a same delay as the output buffer.

7. An apparatus, comprising:
a delay circuit configured to receive a clock signal and further configured to delay the clock signal for a first period measured as a number of clock cycles of the divided clock signal; and
a clock divider circuit configured to divide the clock signal based on the first period, and further configured to provide a divided clock signal.

8. The apparatus of claim 7, wherein the clock divider circuit comprises a logic gate circuit configured to be activated responsive to an enable signal, and
wherein the enable signal is in an enable state based on a division ratio of the clock divider circuit.

9. The apparatus of claim 8, wherein the clock divider circuit comprises a circuit configured to receive data, the circuit comprising:
a first logic circuit configured to receive the data; and
a second logic circuit
configured to provide a first enable signal and a second enable signal that is the enable signal.

10. The apparatus of claim 9,
wherein the first enable signal and the second enable signal are at a same logic level responsive to a first command, and
wherein the first enable signal and the second enable signal are at different logic levels responsive to a second command.

11. The apparatus of claim 9, wherein the first logic circuit is configured to latch the data responsive to an inversion signal of the clock signal.

12. The apparatus of claim 9, wherein the first logic circuit is a flip flop circuit.

13. The apparatus of claim 7, wherein the clock divider circuit is further configured to divide the dock signal based on a division ratio of the clock divider circuit.

14. An apparatus, comprising:
a clock path including a delay circuit, the dock path configured to receive a clock signal; and
a variable clock divider configured to divide the clock signal to provide a divided clock signal based, at least in part, on a delay measured as a number of clock cycles of the divided clock signal to the clock signal by the clock path,
wherein the delay circuit is configured to receive the divided clock signal from the variable clock divider, to delay the divided clock signal, and further configured to provide a delayed divided dock signal.

15. The apparatus of claim 14, wherein the variable clock divider is configured to divide the clock signal responsive to a first command and further configured to stop dividing the clock signal responsive to a second command.

16. The apparatus of claim 14, wherein the variable clock divider comprises;
- a circuit configured to receive a data signal, the circuit comprising:
- a first logic circuit configured to receive the data signal; and
- a second logic circuit configured to provide a first enable signal and a second enable signal;
- a first logic gate circuit coupled to the circuit, configured to receive the clock signal and the first enable signal and further configure to provide a first internal clock signal; and
- a second logic gate circuit coupled to the first logic circuit, configured to receive the first internal clock signal and the second enable signal and further configure to provide a second internal clock signal.

17. The apparatus of claim 16, wherein the second enable signal is an inversion signal of the first enable signal that is delayed by a clock signal.

18. The apparatus of claim 16, wherein the first logic circuit is configured to latch the data signal responsive to an inversion signal of the clock signal, and
- wherein the first enable signal and the latched data signal are at a same logic level responsive to the first command and the first enable signal is set to a fixed logic level responsive to the second command.

19. The apparatus of claim 16, wherein the second logic circuit is configured to receive a control signal;
- wherein the first enable signal and the second enable signal are at different logic levels responsive to the control signal at a first logic level, and
- wherein the first enable signal and the second enable signal are at a same logic level responsive to the control signal at a second logic level.

20. The apparatus of claim 19, wherein the control signal is at the first logic level responsive to a first command and the control signal is at the second logic level responsive to a second command.

* * * * *

UNITED STATES PATENT AND TRADEMARK OFFICE
CERTIFICATE OF CORRECTION

PATENT NO. : 10,931,289 B2
APPLICATION NO. : 16/536079
DATED : February 23, 2021
INVENTOR(S) : Satoh It is certified that error appears in the above-identified patent and that said Letters Patent is hereby corrected as shown below:

In the Claims

| Column 9 Line 20, Claim 17 | Reads | Should Read |
|---|---|---|
| | the first enable signal that is delayed by a clock signal. | the first enable signal that is delayed by a ½ clock signal. |

Signed and Sealed this
Eleventh Day of April, 2023

*Katherine Kelly Vidal*
Katherine Kelly Vidal
*Director of the United States Patent and Trademark Office*